(12) United States Patent
Benz et al.

(10) Patent No.: US 7,839,770 B2
(45) Date of Patent: Nov. 23, 2010

(54) BRANCH ELEMENT FOR OPERATION IN A COMMUNICATION NETWORK, NETWORK AND METHOD FOR OPERATING THE BRANCH ELEMENT

(75) Inventors: Georg Benz, Fürth (DE); Waldemar Wenzel, Fürth (DE)

(73) Assignee: Siemens Aktiengesellschaft, Munich (DE)

( * ) Notice: Subject to any disclaimer, the term of this patent is extended or adjusted under 35 U.S.C. 154(b) by 674 days.

(21) Appl. No.: 11/788,169

(22) Filed: Apr. 19, 2007

(65) Prior Publication Data

US 2007/0248003 A1  Oct. 25, 2007

(30) Foreign Application Priority Data

Apr. 19, 2006  (EP)  .................................. 06008111

(51) Int. Cl.
*G01R 31/11* (2006.01)
*G06F 11/22* (2006.01)

(52) U.S. Cl. .................. 370/222; 370/242; 714/43; 324/534

(58) Field of Classification Search ......... 370/216–228, 370/241–254; 714/43; 398/1–10; 710/216–228, 710/241–254, 100, 260, 301, 305; 326/21, 326/30–34; 340/825.05, 825.01, 3.41–3.43; 324/532–538, 509–511; 700/21–22
See application file for complete search history.

(56) References Cited

U.S. PATENT DOCUMENTS

| | | | |
|---|---|---|---|
| 5,357,491 A * | 10/1994 | Yamasaki | 368/156 |
| 5,920,266 A | 7/1999 | Allgood et al. | |
| 6,640,276 B2 * | 10/2003 | Flaschka et al. | 710/305 |
| 7,355,438 B2 * | 4/2008 | El Sayed | 326/30 |
| 7,454,252 B2 * | 11/2008 | El-Sayed | 700/21 |
| 7,456,635 B2 * | 11/2008 | Akkerman et al. | 324/509 |
| 7,493,524 B2 * | 2/2009 | Fehrmann et al. | 714/43 |

FOREIGN PATENT DOCUMENTS

| | | |
|---|---|---|
| GB | 2 407 237 A | 4/2005 |
| WO | WO 2005/053221 A2 | 6/2005 |

\* cited by examiner

*Primary Examiner*—Aung S Moe
*Assistant Examiner*—Habte Mered

(57) ABSTRACT

A branch element is specified for use in a communication network, whereby in the interplay of two branch elements designed according to the invention, a cleared fault in a communication medium stretching between the two branch elements, in particular a line, with a power supply cable and a current return cable, can be recognized with the help of a test current, which can be supplied by supplying test equipment—preferably provided in each branch element—and which can be detected using terminating test equipment—likewise preferably provided in each branch element—and whereby each terminating test equipment is designed and/or provided to deactivate a bus termination assigned to the respective branch element when the test current is detected.

9 Claims, 2 Drawing Sheets

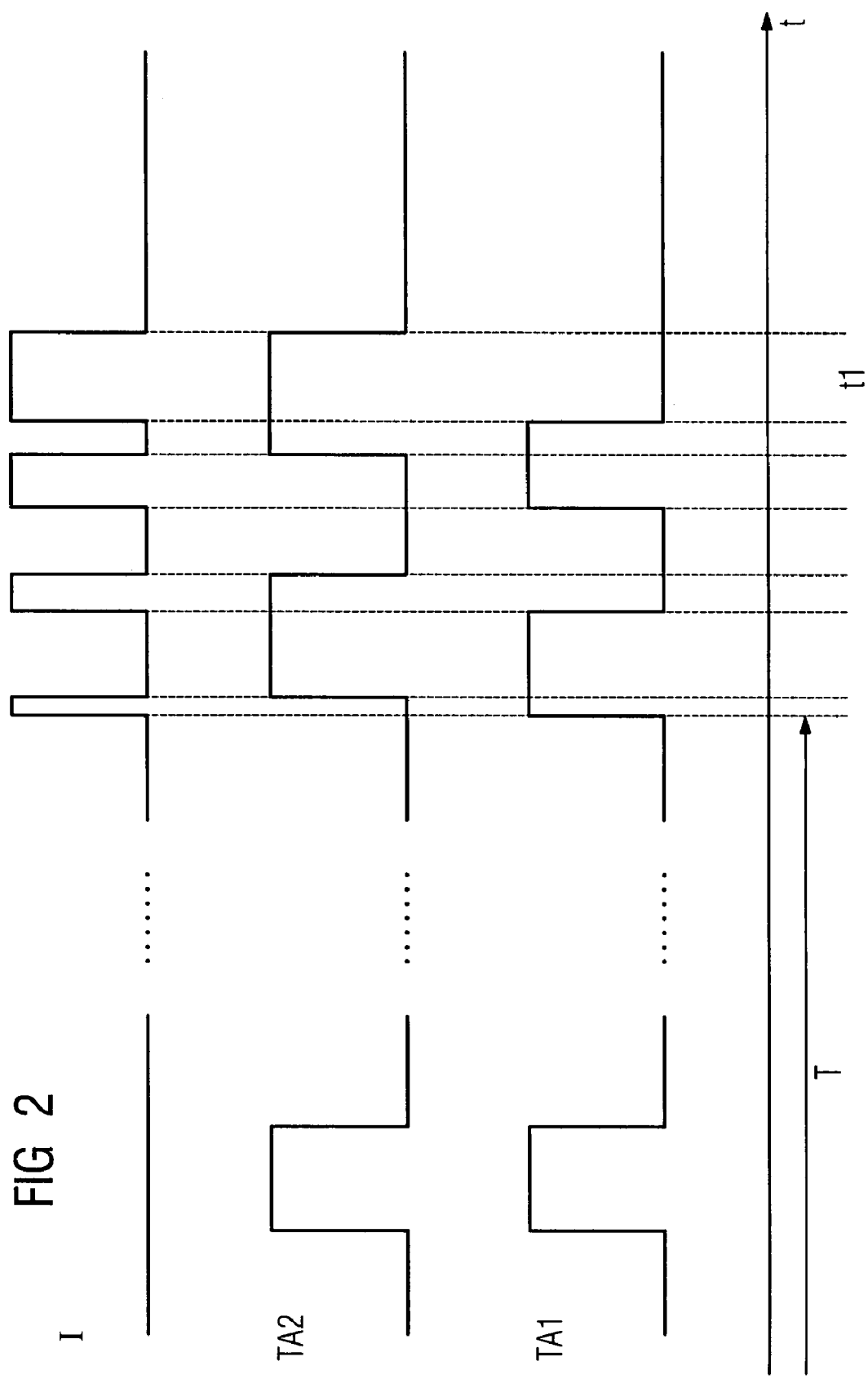

BRANCH ELEMENT FOR OPERATION IN A COMMUNICATION NETWORK, NETWORK AND METHOD FOR OPERATING THE BRANCH ELEMENT

CROSS REFERENCE TO RELATED APPLICATIONS

This application claims priority of European application No. 06008111.4 EP filed Apr. 19, 2006, which is incorporated by reference herein in its entirety.

FIELD OF INVENTION

The invention relates to a branch element for operation in a communication network, such as is known in particular from WO 2005/053221, which is incorporated by reference herein in its entirety. In addition, the invention also relates to a network with at least two branch elements and a method for operating such branch elements.

BACKGROUND OF THE INVENTION

In the case of the redundant communication network according to WO 2005/053221, a fault on a main cable section is isolated by the branch elements provided there. Switches in the main cable separate off the faulty cable. By redundancy switching provided using a redundancy manager, the branch elements sited closest to the location of the fault are supplied with operating voltage from the side facing away from the fault. The redundancy manager uses the branch elements to check the faulty main cable section from both sides by applying a test current and evaluating the current and voltage. With a test of the main cable section from both sides by the same principle the no-fault case is not recognized. In order to cancel out a separation of the main cable in the case of a known fault situation, after carrying out a repair the procedure until now has been manual reactivation e.g. using a key button and a switching pulse triggered by said button.

It is disadvantageous in the respect that a user intervention is always necessary.

SUMMARY OF INVENTION

Thus a task of the invention is to improve the devices mentioned in the introduction and also a corresponding method for operating such devices, and to do so in such a way that the recognition of a fault free state is self-actuated, i.e. automatic.

According to the invention, this object is achieved with a branch element with the features of a independent claim. To this end, provision is made for the branch element to have supplying test equipment and terminating test equipment, for the or each supplying test equipment to be designed and/or provided to supply a test current to the line, for the or each terminating test equipment to be designed and/or provided to detect the test current on the line and for the or each terminating test equipment, when detecting the test current, to be designed and/or provided to deactivate a bus termination assigned to the branch element.

The invention is based on the realization that to identify the fault free state, it is necessary for a branch element to supply a test current and for a further branch element to map the test current termination. It is precisely then that an evaluatable circuit is closed over the cable to be tested, namely the line.

Thus the advantage of the invention consists mainly in that the interaction of the supplying and terminating test equipment enables the fault free state after repair to be recognized automatically, so that the overall system, namely a network having at least two such branch elements, has a "self-repair capability", such that the fault free state after repair is recognized and by deactivating the branch element with the bus termination assigned to the terminating test equipment involved, a separation of the faulty cable that was previously put into effect is reversed.

The dependent claims focus on preferred embodiments of the present invention.

If the supplying test equipment is designed and/or provided to supply the test current in accordance with a predetermined or predeterminable test current supply clock and/or the terminating test equipment is designed and/or provided to detect the test current in accordance with a predetermined or predeterminable test current detection clock, then without communication, synchronization or any such interaction between the branch elements involved it is also possible that during a period of time—i.e. during an "overlapping" of corresponding states of the test current supply clock and test current detection clock—the branch element, in which the supplying test equipment is activated, supplies the test current on the line, in which, in a branch element also involved, the terminating test equipment there is activated, so that the circuit, in which the test current can be evaluated, is closed over the supplying test equipment and the terminating test equipment. With a closed circuit and detection of the test current, it is possible to recognize when the fault free state returns.

The existence of a period of time, during which, simultaneously the supplying test equipment is activated in a first branch element and the terminating test equipment is activated in another branch element involved, can be guaranteed if the test current supply clock is different from the test current detection clock. Then the two determining clocks are asynchronous, so that in finite time there arises a displacement such that during this finite time at least once simultaneously the supplying test equipment is activated in one branch element and the terminating test equipment is activated in another branch element involved.

The supplying test equipment is preferably a test current source arranged in series in a power supply cable of the line with a test current activator switch, whereby the test current source and hence the supply of the test current can be activated with the test current activator switch.

The terminating test equipment also preferably comprises a test current drain arranged in the form of a parallel tap between the power supply cable and a current return cable of the line and a detection activator switch, whereby the test current drain and hence an option to close a circuit provided for the test current, comprising the supplying test equipment, the power supply cable, the terminating test equipment and the current return cable, is activated with the activation of the detection activator switch.

An RC module that can be switched on and off is preferably provided as the bus termination.

In order to operate a branch element of the type mentioned above, provision is made for the supplying test equipment to supply the test current in accordance with the predetermined or predeterminable test current supply clock, in particular into the power supply cable of the line. Provision is further advantageously made for the operation of a branch element for the terminating test equipment to check a presence of the test current on the line in accordance with the predetermined or predeterminable test current detection clock, and in particular by monitoring and identifying a current flow over the test current drain between the power supply cable and the current return cable of the line.

The claims submitted with the application are formulation suggestions without prejudice for the realization of additional protection by patents. The applicant retains the right to claim still further feature combinations, until now only disclosed in the description and/or drawing.

The or each exemplary embodiment is not to be understood as a restriction of the invention. Instead, within the framework of this disclosure, numerous changes and modifications are possible, in particular, such variants, elements and combinations, which, e.g. by the combination or variation of individual features or elements or method steps in connection with the individual features or elements or procedural steps described in the general or special description section and also those contained in the claims and/or the drawing, can be gathered by a person skilled in the art in respect of the solution to the said object, and which, through combinable features, result in a new subject matter or in new method steps or method step sequences, also in as far as they concern manufacturing and test methods.

Backward references used in the subclaims refer to the further development of the subject matter of the main claim through the features of the respective subclaim; they are not to be understood as waiving the realization of an independent, concrete protection for the feature combinations of the related subclaims. In addition, with regard to an interpretation of the claims in the case of a more detailed concretization of a feature in a subordinate claim, it is to be assumed that such a restriction does not exist in the respective preceding claims.

As the subject matter of the subclaims with regard to the prior art can form their own and independent inventions on the priority date, the applicant retains the right to make them the subject matter of independent claims or declarations of division. Furthermore, they can also contain independent inventions that have a design which is independent of the subject matters of the previous subclaims.

BRIEF DESCRIPTION OF THE DRAWINGS

Exemplary embodiments of the invention are explained in more detail below with reference to the drawings. Equivalent objects or elements are given the same reference characters in all figures, in which;

FIG. 1 shows a schematically simplified representation of two branch elements communicatively connected by a line and FIG. 2 shows a timing diagram.

DETAILED DESCRIPTION OF INVENTION

Figure 1:
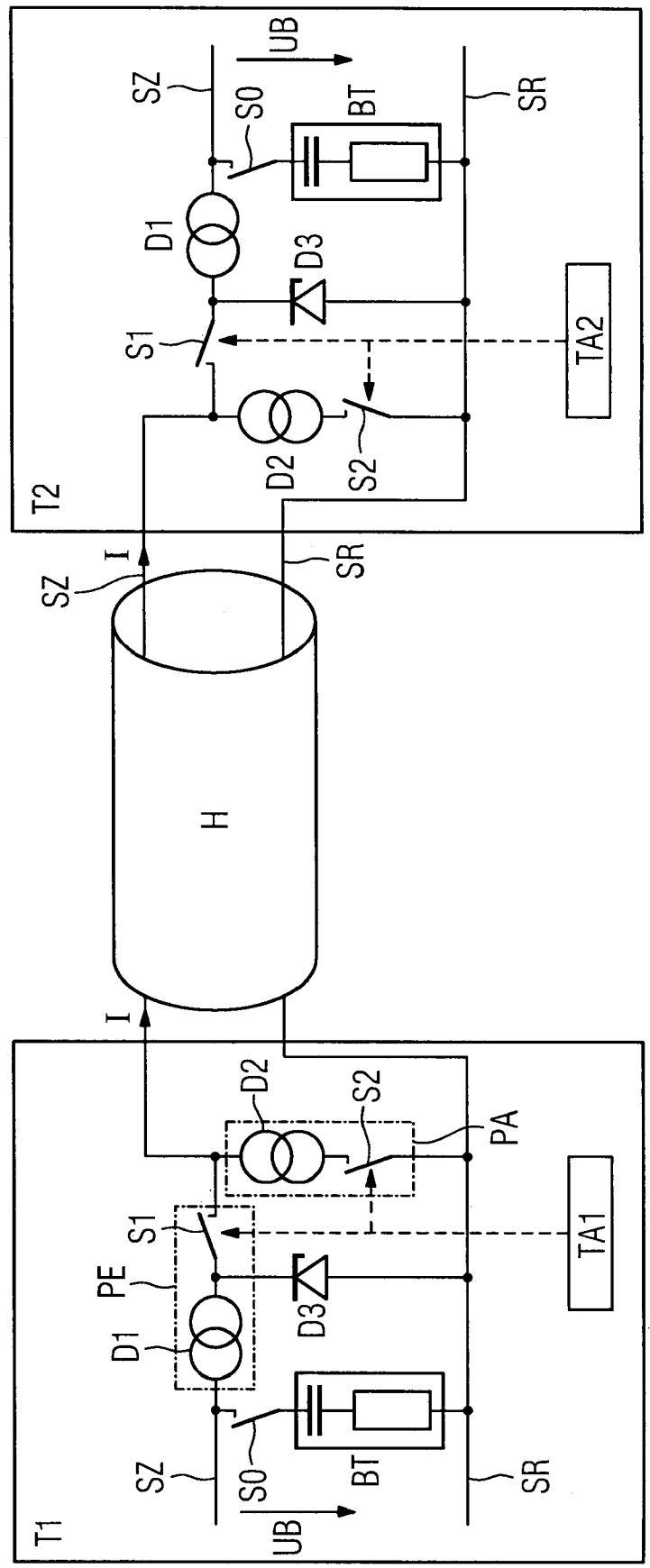

FIG. 1 shows two branch elements T1, T2, as they are individually represented in WO 2005/053221 referred to above, e.g. in FIG. 4.

Between the two branch elements T1, T2, of which, for reasons of clarity, only two are shown, it naturally being possible for a network (compare WO 2005/053221; reference number 11) to comprise more than two branch elements T1, T2, a coupling exists in the form of an electronically conductive connection. The connection between the two illustrated branch elements T1, T2 is subsequently referred to as line H, whereby communicative connections existing between other branch elements (not shown) are likewise realized on the basis of such line segments, so that the line segment H stands representatively for the line segments marked H1, H2, H3, H4 and H5 in WO 2005/053221 as well as for other possible line segments.

Only those details that are of interest in connection with the present invention are shown for the illustrated branch elements T1, T2. For reasons of clarity, further details are not shown, whereby the omission of such elements in the representation does not of course mean that possible additional elements, components or switches, as is given for example in WO 2005/053221, cannot be present in the illustrated branch elements T1, T2.

Each branch element T1, T2 comprises a clock generator TA1, TA2. In addition, each branch element T1, T2 comprises supplying test equipment PE and terminating test equipment PA. The supplying test equipment PE comprises a test current source D1 arranged in series in a power supply cable SZ of the line H and a test current activator switch S1. The terminating test equipment PA comprises a test current drain D2 arranged in the form of a parallel tap between the power supply cable SZ and a current return cable SR of the line H and a detection activator switch S2. Each clock generator TA1, TA2 generates a square wave signal TA1', TA2' (shown in FIG. 2) and hence the test current supply clock or the test current detection clock. Since in the embodiment represented in FIG. 1, both branch elements T1, T2 have an identical set up, the preselected terms, i.e. test current supply clock and test current detection clock, have only been chosen in an effort to denote their distinction in a written or spoken description, so that reference is subsequently made to the square wave signal TA1' generated on the part of the first branch elements T1 as test current supply clock and to the square wave signal TA2' generated on the part of the second branch element T2 as test current detection clock. In the operation, test current input and test current detection takes place alternately with effect for each branch element T1, T2. Thus in each branch element T1, T2 either the supplying test equipment PE or the terminating test equipment PA is activated at a particular point in time. The alternating and mutually excluding activation of either the supplying or the terminating test equipment PE, PA is achieved by the fact that, for example, when the square wave signal TA1' of the clock generator TA1 of the first branch element T1 is at a "high" level, the supplying test equipment PE is activated by closing the test current activator switch S1 assigned to said supplying test equipment PE. At the same time, if the square wave signal TA1' was at such a level, the terminating test equipment PA of the same branch element T1 would be deactivated by opening the detection activator switch S2 assigned to said terminating test equipment PA. In the event of a change in the level of the square wave signals TA1' the situation is reversed, i.e. the terminating test equipment PA is activated and the detection activator switch S2 closed, while the supplying test equipment PE is deactivated because the test current activator switch S1 is opened. A corresponding situation with respect to the activation and deactivation of the supplying or terminating test equipment PE, PA arises for the second termination element T2 because of the signal generator TA2 provided there and the resulting square wave signal TA2'.

The mode of operation of the invention now becomes clear with the help of a further representation as per FIG. 2, in which is shown that, for example, during the initial "high" level of the square wave signal TA1', the square wave signal TA2' is at a "low" level, whereby the "high" level in the square wave signal TA1' effects an activation of the supplying test equipment PE on the part of the first branch element T1 and the "low" level of the second square wave signal TA2' effects an activation of the terminating test equipment PA on the part of the second branch element T2. As can be easily understood with the help of the circuit diagram according to FIG. 1, in such a constellation, a circuit for a test current I given by the test current source D1 of the supplying test equipment PE of the first branch element T1 on the line H, i.e. the power supply cable SZ, via the terminating test equipment PA, in particular the current drain D2 of the second branch element T2 and the current return cable SR, is closed, so that, in fact, a test current I flows, as shown in the diagram according to FIG. 2 in the upper graph for the test current I. During a period of time, during which both square wave signals TA1', TA2' have a "high" level and accordingly, with both branch elements T1, T2 the supplying test equipment PE there is activated, there is no closed circuit, so that no test current I flows, as is also shown accordingly in the graph for the test current I in FIG. 2. Not until the level of both square wave signals TA1', TA2' again differs, thus in the case illustrated when the level of the square wave signal TA1' changes from the "high" level to the "low" level, is there a current flow again, whereby, in this constellation, because of the "low" level in the square wave signal TA1' on the part of the first branch element T1, the terminating test equipment PA there is activated and because of the "high" level in the second square wave signal TA2' on the part of the second branch element T2, the supplying test equipment PE there is activated. Thus compared with the previous constellation, where a circuit resulted for the test current I with the supplying or terminating test equipment PE, PA involved, there now results the quasi reverse or mirror image situation, as the circuit for the test current I via the supplying test equipment PE of the second branch element T2, the power supply cable SZ, the terminating test equipment PA of the first branch element T1 and the current return cable SR of the line H is closed. However in both cases, a test current I is flowing, as can be seen from the graph relating to this in FIG. 2, so that the fault free state of the line H, thus any connection between two adjacent branch elements T1, T2 with at least a power supply cable SZ and a current return cable SR can be recognized.

It is further apparent from FIG. 2 that the two square wave signals TA1' TA2' are asynchronous to each other, whereby such an asynchronism preferably results without additional switching effort and suchlike because of a finite quality, thus in particular influences of temperature and fluctuations in the component parameters of the electrical or electronic components involved and because of varying initial states. This allows one to ensure to a sufficient degree that after a time T different clock states prevail at the branch elements T1, T2.

By means of the constant current source formed from test current source D1 and assigned Zener diode D3, the clocked test current I is decoupled from the actual useful signal, the so-called PA signal. Thus the test current I does not cause any interference of the useful signal.

As soon as the test current I is recognized, a switch, provided as bus termination BT, in particular a terminator of the respective branch element T1, T2 executed as RC module, is switched off. To this end a bus termination switch S0 assigned to the bus termination BT is provided. An excessive signal rise resulting from the test current I and/or from the switching off of the bus termination BT is recognized by the redundancy manager (see WO 2005/053221; there reference character RM). This can then activate the fault free state. Freedom from fault of the line H can then be reliably recognized, if the test current I is present at least for a predetermined and predeterminable period of time t1 (compare FIG. 2). Depending on the modulation of the useful signal, thus, in particular, of the PA signal, whereby in the case of this signal a modulation of 30 kHz is to be assumed, a lower threshold value results for the time t1. With a modulation of 30 kHz the lower threshold value for the time t1 is e.g. thirty microseconds. During this time, the test current I must be present, so that the excessive signal rise of the useful signal occurs for certain.

The time T elapses until the automatic recognition of the "fault free state". A possible fault is present longer for the time T. A new, additional fault is to be regarded as a second fault in this operating state t<T. The time T is chosen to be small and is to be minimized by aiming for a high asynchronism between the square wave signals TA1', TA2', which can be achieved in particular using components with high tolerances.

In summary, the present invention can thus be described briefly as follows: a branch element T1, T2 is specified for use in a communication network, whereby with the interplay of two branch elements T1, T2 designed according to the invention, a cleared fault in a communication medium stretching between the two branch elements T1, T2, in particular a line H, with a power supply cable SZ and a current return cable SR, can be recognized with the help of a test current I, which can be supplied by a supplying test equipment PE (preferably provided in each branch element) and which can be detected using terminating test equipment PA (likewise preferably provided in each branch element T1, T2), and whereby each terminating test equipment PA is designed and/or provided to deactivate a bus termination BT assigned to the respective branch element T1, T2 when the test current I is detected.

The invention claimed is:

1. A branch device to operate in a communication network, having a redundancy characteristic and a line having two line ends connected to a redundancy manager to connect the two line ends to each other in case of a fault event, comprising:
   a supplying test device to supply a test current to the line and to deactivate a bus termination assigned to the branch device when the test current is detected, the supplying test device including an activator switch having open and closed positions for controlling provision of the test current to the line;
   a terminating test device to detect the test current on the line; and
   a clock signal generator connected to the activator switch to provide a clock signal to the activator switch which alternately sets the activator switch in a closed position and an open position, thereby controlling supply of the test current in accord with the clock signal.

2. The branch device as claimed in claim 1, wherein the communication network is a PROFIBUS PA network.

3. The branch device as claimed in claim 1, wherein the line has a power supply cable.

4. The branch device as claimed in claim 3, wherein the supplying test device comprises a test current source arranged in series in the power supply cable and a test current activator switch.

5. The branch device as claimed in claim 3, wherein the line has a current return cable, wherein the terminating test device comprises a detection activator switch and a test current drain arranged electrically parallel between the power supply cable and the current return cable.

6. The branch device as claimed in claim 1, further comprising a RC module as a bus termination.

7. The branch device as claimed in claim 6, further comprising a switch to switch the bus termination on or off.

8. A communication network having a redundancy characteristic, comprising:
   a line having two line ends connected to a redundancy manager to connect the two line ends to each other in case of a fault event;
   first and second branch devices connected to one another through the line, the first branch device having:
      a supplying test device to supply a test current to the line and to deactivate a bus termination assigned to the branch device when the test current is detected, including an activator switch having open and closed positions for controlling provision of the test current to the line, a clock signal generator connected to the activator switch to provide a clock signal to the activator switch which alternately sets the activator switch in a closed position and an open position, thereby controlling supply of the test current in accord with the clock signal; and a terminating test device to detect the test current on the line; and the second branch device having:

a further supplying test device to supply a test current to the line and to deactivate a bus termination assigned to the second branch element when the test current is detected, including an activator switch having open and closed positions for controlling provision of the test current to the line;

a clock signal generator coupled to provide a clock signal which alternately sets the activator switch in a closed position and an open position, thereby controlling supply of the test current in accord with the clock signal; and a further terminating test device to detect the test current on the line.

9. A method for operating first and second branch devices in a communication network, having a redundancy characteristic and a line, having two line ends connected to a redundancy manager to connect the two line ends to each other in case of a fault event, comprising:

connecting the first and second branch devices to one another through the line;

operating each of the branch devices as follows:

supplying a test current from the branch device to the line and deactivating a bus termination assigned to the branch device when the test current is detected, and operating a terminating test device to detect the test current on the line wherein the test current is supplied based upon a current supply clock into a power supply cable of the line, wherein the current supply clocks of the first and second branch devices operate asynchronously with respect to one another enabling a cleared fault between the first and second branch devices to be recognized based on simultaneous current flow through both the first and second branch devices, the method further including reversal of a separation of a faulty cable that was previously put into effect.

* * * * *